United States Patent
Kobayashi et al.

(10) Patent No.: US 6,956,432 B2
(45) Date of Patent: Oct. 18, 2005

(54) TRANSMISSION OUTPUT CORRECTING APPARATUS

(75) Inventors: Eisuke Kobayashi, Yokohama (JP); Kazuhide Yamada, Sendai (JP); Seiichi Yamaguchi, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 451 days.

(21) Appl. No.: 10/152,709

(22) Filed: May 22, 2002

(65) Prior Publication Data

US 2003/0045257 A1 Mar. 6, 2003

(30) Foreign Application Priority Data

May 29, 2001 (JP) .................................... P. 2001-160625

(51) Int. Cl.⁷ .......................... H01Q 11/12; H04B 1/04; H04B 1/06
(52) U.S. Cl. ................. 330/129; 455/127.2; 455/234.1; 375/345
(58) Field of Search ........................... 455/115.1, 127.2, 455/232.1, 234.1, 234.2, 250.1, 239.1, 240.1, 241.1, 245.1, 245.2, 246.1, 247.1, 251.1, 253.1; 375/345; 330/129, 131

(56) References Cited

U.S. PATENT DOCUMENTS

| 5,812,025 | A | * | 9/1998 | Shimazaki | 330/129 |
| 5,862,460 | A | * | 1/1999 | Rich | 455/116 |
| 5,896,064 | A | * | 4/1999 | Kaku | 330/279 |
| 5,982,824 | A | * | 11/1999 | Ann | 375/345 |
| 6,018,650 | A | * | 1/2000 | Petsko et al. | 455/234.1 |
| 6,553,084 | B1 | * | 4/2003 | Maru | 375/345 |
| 6,563,891 | B1 | * | 5/2003 | Eriksson et al. | 375/345 |
| 6,654,594 | B1 | * | 11/2003 | Hughes et al. | 455/245.1 |
| 6,766,151 | B2 | * | 7/2004 | Kusunoki | 455/114.3 |

* cited by examiner

*Primary Examiner*—Simon Nguyen
(74) *Attorney, Agent, or Firm*—Pearne & Gordon LLP

(57) ABSTRACT

A first control unit reads out both specific frequencies and gain data corresponding to these specific frequencies, which have been stored into a first storage unit, and approximates gain data corresponding to an arbitrary frequency by way of a linear function to calculate the gain data by executing a formula. A D/A converter converts this gain data into a gain control signal, and supplies the gain control signal to a variable gain amplifier. The variable gain amplifier amplifies a transmission signal by a gain defined in response to a transmission frequency based upon the gain control signal.

9 Claims, 6 Drawing Sheets

TRANSMISSION OUTPUT CORRECTING APPARATUS

BACKGROUND OF THE INVENTION

The present invention is related to a wireless communication apparatus, and more specifically, a transmission output correcting apparatus for correcting a frequency characteristic of a transmission output.

In a wireless communication apparatus, when transmission output levels are varied in response to frequencies, communicatable distances become unstable, and thus, such an unfavorable phenomenon that communications are interrupted may occur. To avoid such an unfavorable phenomenon, in the conventional wireless communication apparatus, while a variable gain amplifier is employed as a portion of a transmission circuit, transmission power is corrected by variably controlling an amplification gain in response to a frequency.

FIG. 10 is a block diagram of a transmission circuit equipped with the above-described variable gain amplifier. In this drawing, a high frequency signal is amplified by a variable gain amplifier 91, a transmission signal having only a transmission frequency range may pass through a filter 92, and then, the filtered signal is amplified by a power amplifier 93 to a required transmission output level. Thereafter, the amplified signal is outputted to an antenna (not shown) via a filter 94 capable of compensating for a characteristic of the antenna. Normally, while the power amplifier 93 owns an inverse-V-shaped type frequency characteristic as indicated in FIG. 11A, the gain of the variable gain amplifier 91 is variably controlled in order to correct this inverse-V-shaped type frequency characteristic as a flat characteristic as being permitted as possible. Conventionally, while the frequency range is subdivided into a plurality of frequency blocks, the gain of the variable gain amplifier 91 is controlled in order to obtain a desirable transmission output level with respect to each of these frequency blocks, and the controlled gain is stored into a storage unit 96. When a signal transmission operation is carried out, the stored value is read by a control unit 97 to control the gains. FIG. 12 represents an example of a transmission output level which is corrected by the conventional transmission circuit with employment of such a circuit arrangement.

However, as shown in FIG. 12, in the above-described related art, the frequency characteristic within the respective frequency blocks are not made flat, but the discontinuous frequency characteristic is obtained in the overall frequency range. To improve this discontinuous frequency characteristic, although the frequency range may be furthermore subdivided into narrower frequency blocks, the following problem may occur. That is, a total number of data which should be previously stored into the storage unit 96 is increased, and moreover, lengthy time is required for gain controls.

Also, while the frequency characteristic of the transmission output level is also changed, depending upon temperature characteristics of components which constitute the transmission circuit, this frequency characteristic will be varied, for example, as represented in FIG. 11B. As a result, there is such a problem that the high precision correction of the transmission output level can be hardly carried out by merely subdividing the frequency range into the plural frequency blocks so as to correct the transmission output levels with respect to the respective frequency blocks.

SUMMARY OF THE INVENTION

The present invention has been made to solve the above-described problem, and therefore, has an object to provide a transmission output correcting apparatus capable of improving correction precision of a frequency characteristic of a transmission output level in a transmission circuit. Also, another object of the present invention is to provide another transmission output correcting apparatus capable of maintaining a frequency characteristic of a transmission output level in a transmission circuit under flat condition and at a constant level irrespective of an ambient temperature. Furthermore, another object of the present invention is to provide both a wireless communication apparatus and a portable telephone, which are equipped with these transmission output correcting apparatus, and are capable of improving a wireless transmission characteristic.

According to a first aspect of the invention, a transmission output correcting apparatus in which a frequency range is subdivided into a plurality of frequency blocks and a gain control operation is carried out every the frequency block, includes: a variable gain unit for inputting thereinto a high frequency signal and capable of variably changing an amplification gain based upon a gain control signal; a storage unit for storing specific frequencies and data of gains corresponding to the specific frequencies; a control unit for reading out both the specific frequencies and the gain data from the storage unit, and for executing a predetermined calculation to calculate gain data at an arbitrary frequency; and a D/A converter for converting the calculated gain data into the gain control signal.

According to a second aspect of the invention, a transmission output correcting apparatus in which a frequency range is subdivided into a plurality of frequency blocks and a gain control operation is carried out every the frequency block, includes: a variable gain unit for inputting thereinto a high frequency signal and capable of variably changing an amplification gain based upon a gain control signal; a storage unit for storing specific frequencies and data of gains corresponding to the specific frequencies; a control unit for reading out both the specific frequencies and the gain data from the storage unit, and for executing a predetermined calculation to calculate such a frequency at which a transmission output before a correction is performed becomes maximum, and also for correcting the specific frequency data based upon a difference between the calculated frequency and the frequency at which the transmission output before the correction is performed becomes maximum and which has been stored in the storage unit; and a D/A converter for converting the gain data at the corrected frequency data into the gain control signal.

According to the third aspect of the invention, a transmission output correcting apparatus in which a transmission frequency range is subdivided into a plurality of frequency blocks and a gain control operation is carried out every the frequency block, includes: a variable gain unit for inputting thereinto a high frequency signal and capable of variably changing an amplification gain based upon a gain control signal; a storage unit for storing specific frequencies and data of gains corresponding to the specific frequencies; a first control unit for reading out both the specific frequencies and the gain data from the storage unit, and for executing a predetermined calculation to correct the specific frequency data; a second control unit for reading both the corrected specific frequency data and the gain data from the storage unit to calculate gain data at an arbitrary frequency; and a D/A converter for converting the calculated gain data into the gain control signal.

According to the above aspects, the gain of the variable gain unit may be variably controlled in response to the transmission frequency, and thus, the transmission output level may be maintained at a constant level and in high precision over a transmission frequency range.

According to the fourth aspect of the invention, a transmission output correcting apparatus in which a transmission frequency range is subdivided into a plurality of frequency blocks and a gain control operation is carried out every the frequency block, includes: a variable gain unit for inputting thereinto a high frequency signal and capable of variably changing an amplification gain based upon a gain control signal; a temperature sensor for sensing an ambient temperature to output a temperature sensing signal; a storage unit for storing specific frequency blocks, gain data corresponding to the specific frequency blocks, and a frequency at which a transmission output before a correction is carried out at a specific temperature becomes maximum; a control unit for reading out the frequency at which the transmission output before the correction is performed becomes maximum from the storage unit, for executing a predetermined calculation to calculate such a frequency at which a transmission output before a correction is carried out at an arbitrary temperature becomes maximum, and for correcting the specific frequency block data based upon a difference between the calculated frequency and such a frequency at which the transmission output before the correction is performed at an ordinary temperature becomes maximum and which has been stored into the storage unit; and a D/A converter for converting the gain data corresponding to the corrected frequency block data.

According to the fifth aspect of the invention, a transmission output correcting apparatus in which a transmission frequency range is subdivided into a plurality of frequency blocks and a gain control operation is carried out every the frequency block, includes: a variable gain unit for inputting thereinto a high frequency signal and capable of variably changing an amplification gain based upon a gain control signal; a temperature sensor for sensing an ambient temperature to output a temperature sensing signal; a storage unit for storing specific frequencies, gain data corresponding to the specific frequencies, and a frequency at which a transmission output before a correction is carried out at a specific temperature becomes maximum; a first control unit for reading out the frequency at which the transmission output before the correction is performed becomes maximum from the storage unit, for executing a predetermined calculation to calculate such a frequency at which a transmission output before a correction is carried out at an arbitrary temperature becomes maximum, and for correcting the specific frequency data based upon a difference between the calculated frequency and such a frequency at which the transmission output before the correction is performed at an ordinary temperature becomes maximum and which has been stored into the storage unit; a second control unit for reading out both the corrected specific frequency data and the gain data from the storage unit, and for executing a predetermined calculation to calculate gain data at an arbitrary frequency; and a D/A converter for converting the calculated gain data into the gain control signal.

According to the sixth aspect of the invention, a transmission output correcting apparatus in which a transmission frequency range is subdivided into a plurality of frequency blocks and a gain control operation is carried out every the frequency block, includes: a variable gain unit for inputting thereinto a high frequency signal and capable of variably changing an amplification gain based upon a gain control signal; a temperature sensor for sensing an ambient temperature to output a temperature sensing signal; a storage unit for storing specific frequencies, gain data corresponding to the specific frequencies, and a frequency at which a transmission output before a correction is carried out at a specific temperature becomes maximum; a first control unit for reading out both the specific frequencies and the gain data from the storage unit, and for executing a predetermined calculation to calculate such a frequency at which a transmission output before a correction is performed becomes maximum, and also for correcting the specific frequency data based upon a difference between the calculated frequency and the frequency at which the transmission output before the correction at an ordinary temperature is performed becomes maximum and which has been stored in the storage unit; a second control unit for reading out the frequency at which the transmission output before the correction is performed becomes maximum from the storage, for executing a predetermined calculation to calculate such a frequency at which a transmission output before a correction is carried out at an arbitrary temperature becomes maximum, and for further correcting the specific frequency data based upon a difference between the calculated frequency and such a frequency at which the transmission output before the correction is performed at the ordinary temperature becomes maximum and which has been stored into the storage unit; and a D/A converter for D/A-converting the gain data at the corrected frequency data into the gain control signal.

According to the seventh aspect of the invention, a transmission output correcting apparatus in which a transmission frequency range is subdivided into a plurality of frequency blocks and a gain control operation is carried out every the frequency block, includes: a variable gain unit for inputting thereinto a high frequency signal and capable of variably changing an amplification gain based upon a gain control signal; a temperature sensor for sensing an ambient temperature to output a temperature sensing signal; a storage unit for storing specific frequencies, gain data corresponding to the specific frequencies, and a frequency at which a transmission output before a correction is carried out at a specific temperature becomes maximum; a first control unit for reading out both the specific frequencies and the gain data from the storage unit, and for executing a predetermined calculation to calculate such a frequency at which a transmission output before a correction is performed becomes maximum, and also for correcting the specific frequency data based upon a difference between the calculated frequency and the frequency at which the transmission output before the correction is performed becomes maximum at an ordinary temperature and which has been stored in the storage unit; a second control unit for reading out the frequency at which the transmission output before the correction is performed becomes maximum from the storage unit, for executing a predetermined calculation to calculate such a frequency at which a transmission output before a correction is carried out at an arbitrary temperature becomes maximum, and for further correcting the corrected specific frequency data based upon a difference between the calculated frequency and such a frequency at which the transmission output before the correction is performed at the ordinary temperature becomes maximum and which has been stored into the storage unit; a third control unit for reading out both the further-corrected specific data and the gain data from the storage unit, and for executing a predetermined calculation to gain data at an arbitrary frequency; and a D/A converter for converting the gain data at the corrected frequency data into the gain control signal.

According to the above aspects, the gain of the variable gain unit may be variably controlled in response to both the temperature and the transmission frequency, and thus, the transmission output level may be maintained at a constant level and in high precision over a transmission frequency range.

According to a eighth aspect of the invention, a wireless communication apparatus comprising a wireless transmission circuit equipped with the transmission output correcting apparatus as disclosed in any one of first to seventh aspects of the invention.

According to the ninth aspect of the invention, a portable telephone includes a wireless transmission circuit equipped with the transmission output correcting apparatus as disclosed in any one of first to seventh aspects of the invention.

According to the above aspects, the transmission output level may be maintained at a constant level and in high precision over a transmission frequency range, thus improving transmission characteristics of the wireless communication apparatus or the portable telephone.

DETAILED DESCRIPTION OF THE PREFERRED EMBODIMENT

Figure 1:
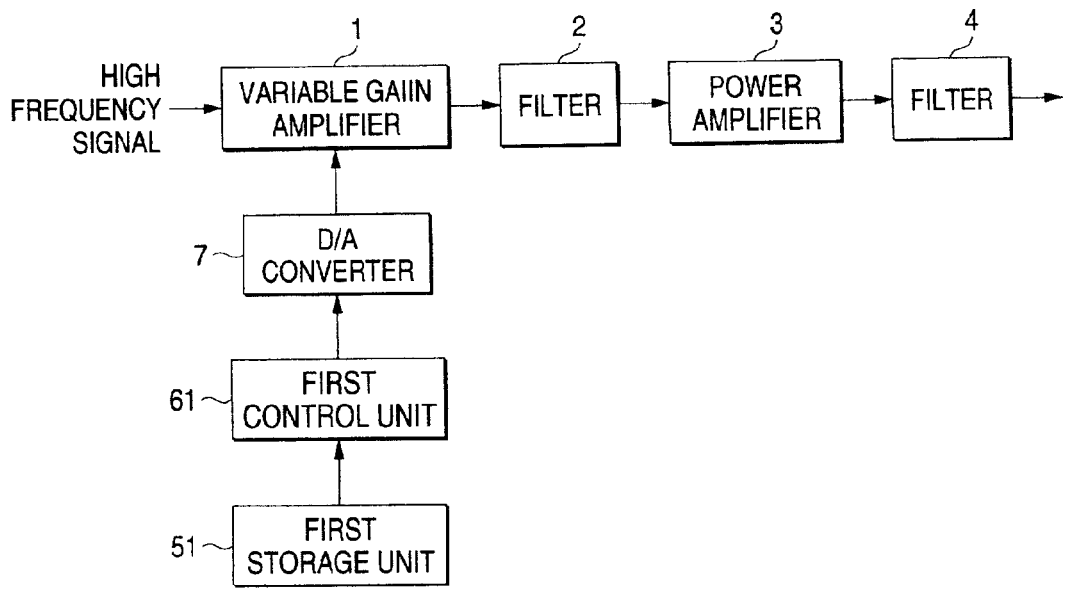
FIG. 1 is a block diagram for indicating a transmission circuit equipped with a transmission output correcting apparatus according to a first embodiment mode of the present invention.

A major feature of the present invention is given as follows: That is, while a transmission frequency range is subdivided into a plurality of frequency blocks, a correction is carried out with respect to each of the subdivided frequency blocks. For the sake of easy understandings as to principle operation executed in descriptions of the embodiments, assuming now that the transmission frequency range is present between specific frequencies of "o" and "s", such a model will now be described, in which the transmission frequency range is subdivided into four frequency blocks while specific frequencies of "p", "q", "r" are used as boundaries. In this case, while a relationship among these specific frequencies is given as o<p<q<r<s, the specific frequency of "q" is assumed as such a frequency (will be referred to as a "local maximum frequency" hereinafter) at which when a gain of a variable gain amplifier 1 employed as a variable gain unit is made constant (namely, when no correction is made), a transmission output becomes maximum, otherwise, this specific frequency of "q" is assumed as a frequency approximated to this local maximum frequency.

Referring now to drawings, various embodiments of the present invention will be described in detail. It should be understood that the same reference numerals will be employed as those for denoting structural elements which are commonly used in the respective drawings.

[Embodiment 1]

FIG. 1 is a block diagram for indicating a structure of a transmission circuit equipped with a transmission output correcting apparatus according to a first embodiment of the present invention. In this drawing, the transmission output correcting apparatus includes a variable gain amplifier 1, a filter 2, a power amplifier 3, another filter 4, and a D/A converter 7. The variable gain amplifier 1 is employed as a variable gain unit for amplifying a high frequency signal inputted into the transmission output correcting apparatus. The filter 2 limits the amplified transmission signal to a predetermined bandwidth. The power amplifier 3 amplifies the filtered transmission signal to a transmission output level. The filter 4 restricts a transmission range of the amplified transmission signal in correspondence with an antenna characteristic. The D/A converter 7 converts gain data corresponding to a digital value into an analog gain value, and supplies a gain control signal produced by this D/A converting operation to the variable gain amplifier 1. Furthermore, the transmission output correcting apparatus includes a first storage unit 51, and a first control unit 61. In this first storage unit 51, various data as to the specific frequencies and gains have been stored. The first control unit 61 reads out the respective data as to the specific frequencies and the gains from the first storage unit 51, executes a predetermined calculation of the read data in order to calculate gain data at an arbitrary frequency, and then, outputs this calculation result to the D/A converter 7.

In this first embodiment, assuming now that a transmission output level within one frequency block of a narrow band is changed in a linear manner in response to a frequency, such gain data at an arbitrary frequency within the frequency block is approximated by way of a linear equation to be calculated from both frequencies at edge portions of the frequency block and gain data corresponding to these frequencies. Since this method is applied to other frequency blocks, such gain data at an arbitrary frequency within an overall frequency range is obtained.

Next, a description will now be made of a principle idea as to operations of this transmission output correcting apparatus. As represented in a table 1, it is firstly assumed that the specific frequencies o, p, q, r, and s, and also gain data E, A, B, C, and D have been stored into the first storage unit 51. In the beginning, the following case will now be considered. That is, a transmission frequency is located in such a frequency block between the specific frequencies of "p" and "q."

TABLE 1

| data number | frequency | gain data |
|---|---|---|
| <1> | o | E |
| <2> | p | A |
| <3> | q | B |
| <4> | r | C |
| <5> | s | D |

The first control unit 61 reads out from the first storage unit 51, both the specific frequencies of "p" and "q", and also the gain data of "A" and "B" corresponding to these frequencies. Then, as described above, assuming now that the gain data are changed in the linear manner between the frequencies of "p" and "q", such gain data "X" corresponding to an arbitrary frequency of "f" is calculated based upon, for example, the below-mentioned calculated formula:

$$X = \frac{(A-B)(f-p)}{(p-q)} + A \qquad \text{(Formula 1)}$$

Similarly, as to an arbitrary frequency in another frequency block, the first control unit 61 reads out from the first storage unit 51, both frequencies of both ends of this frequency block and gain data corresponding to these frequencies. Then, the first control unit 61 calculates such gain data corresponding to the arbitrary frequency within the frequency block by executing the calculation.

The first control unit 61 supplies the gain data X which has been calculated in such a manner to the D/A converter 7. The D/A converter 7 converts this gain data into a gain control signal and then outputs this gain control signal to the variable gain amplifier 1. As a result, the gain of the variable gain amplifier 1 is variably controlled in response to the transmission frequency, while the transmission output level is maintained at the constant level over the entire transmission range.

[Embodiment 2]

Figure 2:
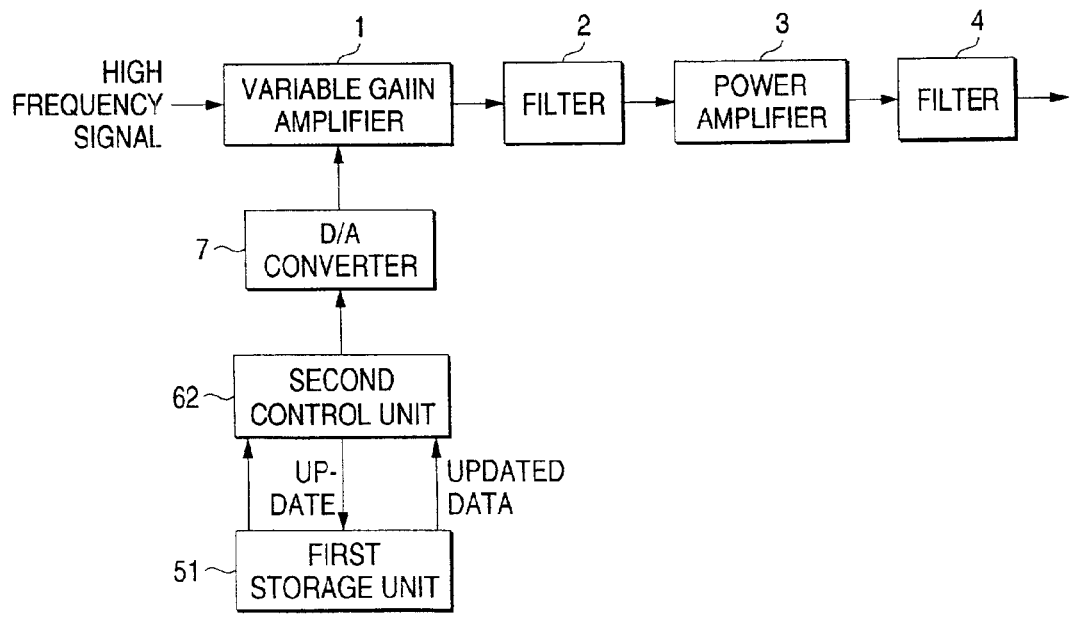
FIG. 2 is a block diagram for showing a transmission circuit equipped with a transmission output correcting apparatus according to a second embodiment mode of the present invention.

FIG. 2 is a block diagram for showing a structure of a transmission circuit equipped with a transmission output correcting apparatus according to a second embodiment of the present invention. This transmission circuit is includes a second control unit 62 instead of the first control unit 61 of the first embodiment shown in FIG. 1. The second control unit 62 reads out both specific frequencies and the respective data of gains corresponding to these specific frequencies from the first storage unit 51, and performs a predetermined calculation by using these read frequencies and gain data so as to correct frequency data. Also, the second control unit 26 outputs the resultant frequency data to the D/A converter 7. It should also be noted that the same reference numerals shown in FIG. 1 will be employed as those for denoting the same structures of FIG. 2, and explanations thereof are omitted.

In this second embodiment, in the case that both the specific frequencies and the respective gain data corresponding thereto, which have been previously stored in the first storage unit 51, are deviated from the original values thereof due to fluctuations of components for constituting the transmission circuit, the frequency data is corrected every frequency block. First, an arbitrary frequency block is selected which is lower than a local maximum frequency, and then, frequencies of both ends of this frequency block and gain data corresponding to these frequencies are approximated based upon a linear equation. Similarly, such a frequency block is selected which is higher than the local maximum frequency, and then, frequencies of both ends of this frequency block and gain data corresponding to these frequencies are approximated based upon another linear equation. Then, both the linear equations are solved in order to calculate both a local maximum frequency and gain data corresponding to this local maximum frequency. Next, while a difference between this calculated local maximum frequency and the previously stored local maximum frequency is calculated, both other frequencies and the gain data corresponding to these frequencies are corrected based upon this frequency difference.

Next, a principle idea of operations of this second embodiment will now be described. First, such an example that either the local maximum frequency or a frequency approximated to this local maximum frequency is equal to "q" is explained with reference to FIG. 3. Assuming now that a local maximum frequency to be updated and gain data corresponding to this local maximum frequency are equal to "v" and "w" respectively, the first control unit 61 reads out from the first storage unit 51 the data <1>, <2>, <4>, and <5> of the table 1 which have previously been stored thereinto, and then, calculates "v" and "w" in accordance with the below-mentioned linear equations (2) and (3) which are conducted from these data:

$$W = \frac{(E-A)(v-o)}{(o-p)} + E \qquad \text{(Formula 2)}$$

$$W = \frac{(C-D)(v-r)}{(r-s)} + C \qquad \text{(Formula 3)}$$

Figure 3:
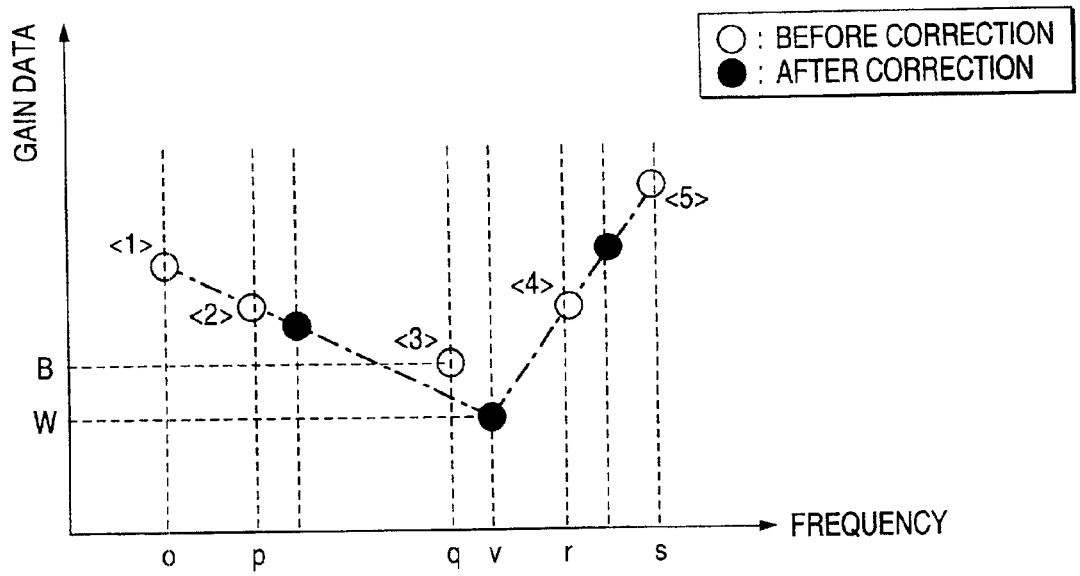
FIG. 3 is a graph for graphically representing frequencies and gain data corresponding to these frequencies, which are stored in the first storage unit of the second embodiment mode of the present invention.

FIG. 3 is a graphic representation in which the frequencies of the end portions of the frequency blocks and the gain data corresponding to these frequencies are plotted, while the data of the table 1 stored in the first storage unit 51 are indicated by white blanked circles. The frequency "v" and the gain data "w", which are calculated by the above formulae, are indicated by black solid circles in FIG. 3. The second control unit 62 performs a correction in such a manner that the white blanked circles are moved to the positions of the black solid circles. Furthermore, as to the data <2> and <4>, the second control unit 62 corrects both frequencies and gain data in such a manner that these data correspond to (v–q) and becomes a linear relationship. Then, the second control unit 62 updates the data indicated in the table 1, which have been stored in the first storage unit 51, by using these corrected data.

While the transmission operation is carried out, the second control unit 62 reads out from the first storage unit 51 both the updated frequencies and the updated gain data corresponding to these updated frequencies indicated in the table 1, and then, supplies these read frequencies and gain data to the D/A converter 7. This D/A converter 7 D/A-converts these supplied data into a gain control signal, and outputs this gain control signal to the variable gain amplifier 1. As a result, the gain of the variable gain amplifier 1 is variably controlled in response to the transmission frequency, and the transmission output level is maintained at a constant level over the entire transmission range.

It should also be understood that when the local maximum frequency is calculated, the linear equation is conducted based upon two sets of the frequencies and the gain data in the above explanation. Alternatively, while three, or more sets of the frequencies and the gain data are employed, a least squares method may be applied thereto so as to conduct the linear equation. As a result, the data can be corrected by eliminating an error, and thus, the gain correction precision may be considerably improved.

[Embodiment 3]

Figure 4:
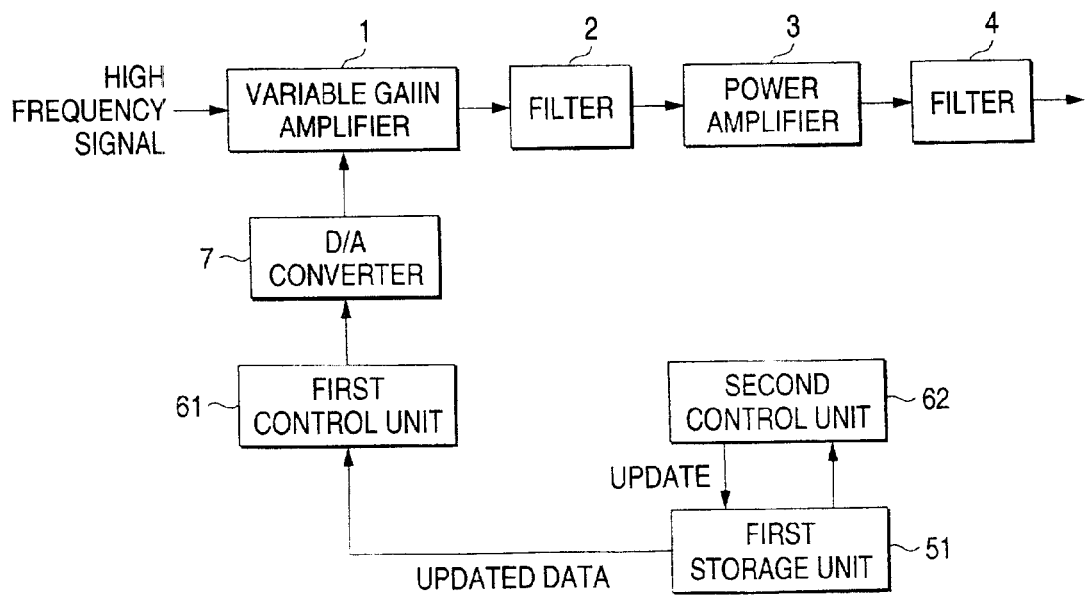
FIG. 4 is a block diagram for indicating a transmission circuit equipped with a transmission output correcting apparatus according to a third embodiment mode of the present invention.

FIG. 4 is a block diagram for showing a structure of a transmission circuit equipped with a transmission output correcting apparatus according to a third embodiment of the present invention. This transmission circuit is arranged in addition to the structure of the first embodiment shown in FIG. 1, while such a second control unit 62 is employed. That is, this second control unit 62 reads out specific frequencies and the respective data of gains corresponding to these specific frequencies, which have been previously stored in the first storage unit 51, and then, executes a predetermined calculation so as to correct/update the frequency data of the first storage unit 51. It should also be noted that the same reference numerals shown in FIG. 1 will be employed as these for denoting the same structures of FIG. 4, and explanations thereof are omitted.

This third embodiment corresponds to such an embodiment constituted by combining the first embodiment with the second embodiment, in which the frequency data are corrected/updated based upon a difference between a local maximum frequency calculated by way of a calculation and a previously stored local maximum frequency. Then, gain data at an arbitrary frequency within a frequency block is acquired by executing a calculation based upon the updated frequency data, and then, this acquired gain data is extended to all of the frequency blocks, so that such gain data at arbitrary frequencies within an entire frequency range may be acquired.

Next, a principle idea of operations of the third embodiment will now be explained. First, the second control unit 62 calculates both a local maximum frequency "v" and gain data "W" at this local maximum frequency based upon a frequency and gain data corresponding to this frequency as indicated in the table 1, which have been previously stored in the first storage unit 51, and updates the data of the table 1 based on the calculated local maximum frequency "v" and the gain data "W" as explained in the second embodiment. Next, the first control unit 61 reads out both the updated frequency and the updated gain data from the first storage unit 51, and then, executes such a calculation as described in the first embodiment to calculate gain data "X" corresponding to an arbitrary frequency. The gain data "X" calculated in this manner is supplied to the D/A converter 7. This D/A converter 7 D/A-converts this supplied gain data "X" into a gain control signal, and outputs this gain control signal to the variable gain amplifier 1. As a result, the gain of the variable gain amplifier 1 is variably controlled in response to the transmission frequency, and the transmission output level is maintained at a constant level over the entire transmission range.

[Embodiment 4]

Figure 5:
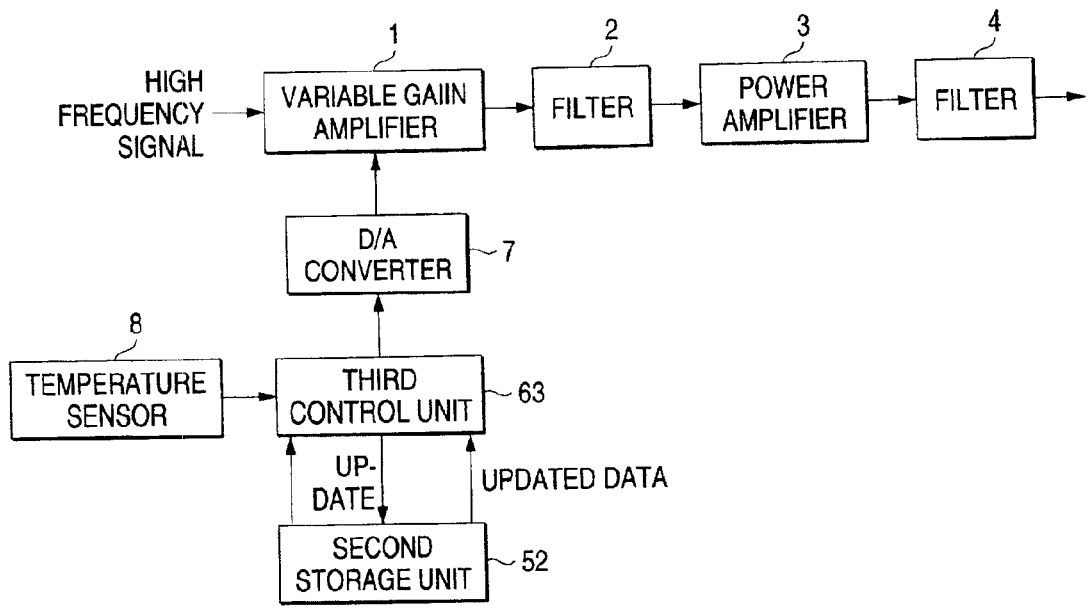
FIG. 5 is a block diagram for showing a transmission circuit equipped with a transmission output correcting apparatus according to a fourth embodiment mode of the present invention.

FIG. 5 is a block diagram for showing a structure of a transmission circuit equipped with a transmission output correcting apparatus according to a fourth embodiment of the present invention. The transmission circuit of this fourth embodiment is arranged in such a manner that instead of both the fist storage unit 51 and the first control unit 61 of the first embodiment shown in FIG. 1, a second storage unit 52, a third control unit 63, and a temperature sensor 8 are employed. In the second storage unit 52, specific frequency blocks, data of gains corresponding thereto, and local maximum frequency data at an ordinary temperature and a specific temperature have been stored. The third control unit 63 reads out data from this second storage unit 52, and executes a predetermined calculation based upon this read data so as to correct a subdivision of a frequency block at an arbitrary temperature, and further, outputs the correction result to the D/A converter 7. The temperature sensor 8 senses an ambient temperature to output a temperature sensing signal. It should also be noted that the same reference numerals shown in FIG. 1 will be employed as those for denoting the same structures of FIG. 5, and explanations thereof are omitted.

In this fourth embodiment, assuming now that local maximum frequencies are changed in a linear manner in response to a temperature, such a local maximum frequency at an arbitrary temperature is approximated by way of a linear equation based upon the ordinary temperature, the specific temperature, and the local maximum frequencies at the respective temperatures, and is obtained by performing a calculation. Then, a difference between the calculated local maximum frequency and the previously stored local maximum frequency is calculated, and a correction of a frequency block is carried out based upon this calculated difference.

Next, a description is made of a principle idea of operations of the fourth embodiment. First, the following assumption is made. That is, in the second storage unit 52, as indicated in a table 2, the four frequency blocks which are segmented by the specific frequencies "o", "p", "q", "r", and "s", and the gain data "E", "A", "B", and "C" corresponding thereto have been previously stored, and further, as shown in another table 3, both local maximum frequencies "J" and "K" at an ordinary temperature "$t_0$" and a specific temperature "$t_1$" have been previously stored.

TABLE 2

| data number | frequency "f" | gain data |
|---|---|---|
| <6> | o ≦ f < p | E |
| <7> | p ≦ f < q | A |
| <8> | q ≦ f < r | B |
| <9> | r ≦ f < s | C |

TABLE 3

| date number | temperature | local maximum frequency |
|---|---|---|
| <10> | $t_1$ | J |
| <11> | $t_0$ | K |

The third control unit 63 reads out from the second storage unit 52, the ordinary temperature "$t_0$", the specific temperature "$t_1$", and local maximum frequencies at the respective temperatures, and then, calculates a local maximum frequency "L" at an arbitrary temperature "t" in accordance with the below-mentioned formula based upon the read temperatures and local maximum frequencies:

$$L = \frac{(J-K)(x-t_1)}{(t_0-t_1)} + J \qquad \text{(Formula 4)}$$

Subsequently, the third control unit 63 calculates a difference "z" between the local maximum frequency "L" calculated in this manner and the local maximum frequency "K" at the ordinary temperature "$t_0$". Then, the third control unit 63 reads out the data indicated in the table 2 from the second storage unit 52, and corrects the frequency segment by employing the calculated difference "z", and then, updates the data stored in the second storage unit 52 as indicated in a table 4.

TABLE 4

| data number | frequency "f" | gain data |
|---|---|---|
| <12> | o ≦ f < p–z | E |
| <13> | p–z ≦ f < q–z | A |
| <14> | p–z ≦ f < r–z | B |
| <15> | r–z ≦ f < s | C |

While the transmission operation is carried out, the third control unit 63 reads out from the second storage unit 52, the gain data in which the frequency segment is updated in response to the ambient temperature at this time, and then, supplies the read gain data to the D/A converter 7. This D/A converter 7 D/A-converts this gain data into a gain control signal and then, supplies this gain control signal to the variable gain amplifier 1. As a result, the gain of the variable gain amplifier 1 may be variably controlled in response to both the ambient temperature and the transmission frequency, and thus, the transmission output level may be maintained at a constant level and in high precision.

[Embodiment 5]

Figure 6:
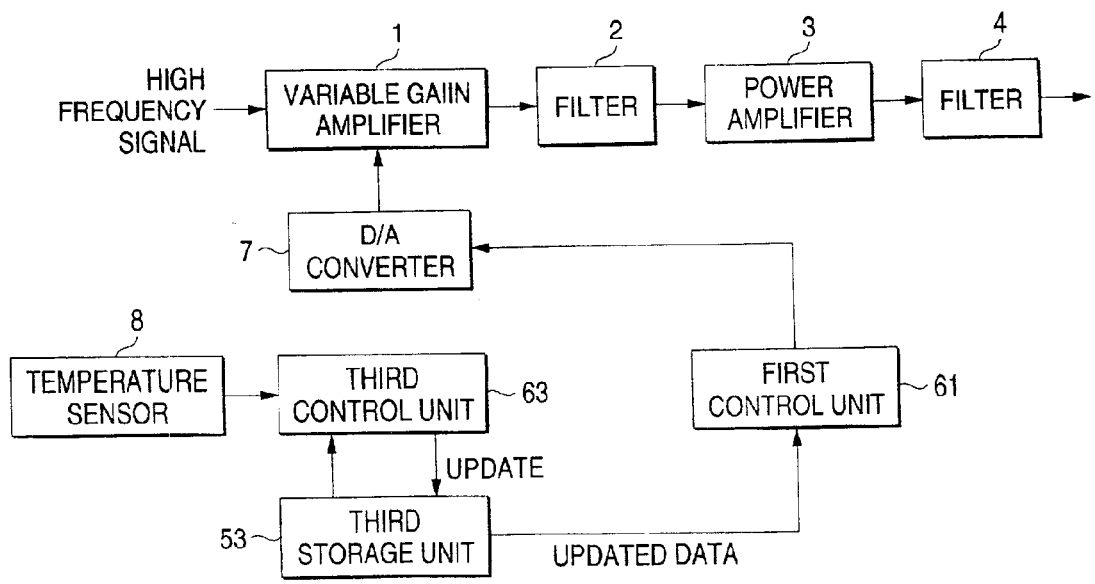
FIG. 6 is a block diagram for indicating a transmission circuit equipped with a transmission output correcting apparatus according to a fifth embodiment mode of the present invention.

FIG. 6 is a block diagram for showing a structure of a transmission circuit equipped with a transmission output correcting apparatus according to a fifth embodiment mode of the present invention. The transmission circuit of this fifth embodiment is arranged in such a manner that in addition to the arrangement of the first embodiment shown in FIG. 1, a third storage unit 53, a third control unit 63, and a temperature sensor 8 are employed. In the third storage unit 53, specific frequencies, data of gains corresponding thereto, and local maximum frequency data at an arbitrary temperature and a specific temperature have been stored. The third control unit 63 reads out gain data from this third storage unit 53, and executes a predetermined calculation based upon this read gain data so as to correct a subdivision of a frequency block at an arbitrary temperature, and updates the data contents of the third storage unit 53. The temperature sensor 8 senses an ambient temperature to output a temperature sensing signal. It should also be noted that the same reference numerals shown in FIG. 1 will be employed as those for denoting the same structure of FIG. 6, and explanations thereof are omitted.

This fifth embodiment corresponds to such an embodiment accomplished by combining the first embodiment with the fourth embodiment. In this fifth embodiment, a local maximum frequency at an arbitrary temperature is calculated based upon the ordinary temperature, the specific temperature, and the local maximum frequencies at the respective temperatures, and the specific frequencies are corrected and updated based upon a difference between the calculated maximum frequency and the previously-stored local maximum frequency. Then, such gain data at an arbitrary frequency within a frequency block is acquired by way of a calculation based upon the updated data. This gain data is extended to all of the frequency blocks, so that gain data at arbitrary frequencies within the entire frequency range are obtained.

Next, a description is made of a principle idea of operations of the fifth embodiment. First, the following assumption is made. That is, in the third storage unit 53, as indicated in a table 1, the specific frequencies "o", "p", "q", "r", and "s", and the gain data "E", "A", "B", "C", and "D" corresponding thereto have been previously stored, and further, as shown in another table 3, both local maximum frequencies "J" and "K" at an ordinary temperature "$t_0$" and a specific temperature "$t_1$", and also gain data corresponding to the respective local maximum frequencies have been previously stored.

The third control unit 63 reads out from the third storage unit 53 the above-described ordinary temperature "$t_0$", the specific temperature "$t_1$", and the local maximum frequencies at the respective temperatures, and then, calculates a local maximum frequency "L" at an arbitrary temperature "t", as described in the third embodiment.

Subsequently, the third control unit 63 calculates a difference "z" between the local maximum frequency "L" calculated in this manner and the local maximum frequency "K" at the ordinary temperature "$t_0$", and corrects/updates the frequency data of the table 1 which have been stored in the third storage unit 53 by employing this difference "z" as represented in a table 5:

TABLE 5

| data number | frequency | gain data |
|---|---|---|
| <16> | a | E |
| <17> | p–z | A |
| <18> | q–z | B |
| <19> | r–z | C |
| <20> | s | D |

While the transmission operation of this fifth embodiment is carried out, the first control unit 61 reads out the updated gain data from the third storage unit 53, and as previously explained in the first embodiment, acquires such gain data corresponding to an arbitrary frequency, and then, supplies this acquired gain data to the D/A converter 7. This D/A converter 7 D/A-converts these gain data into gain control signals and then, supplies these gain control signals to the variable gain amplifier 1. As a result, the gain of the variable gain amplifier 1 may be variably controlled in response to both the temperature and the transmission frequency, and thus, the transmission output level may be maintained at a constant level and in high precision.

[Embodiment 6]

Figure 7:
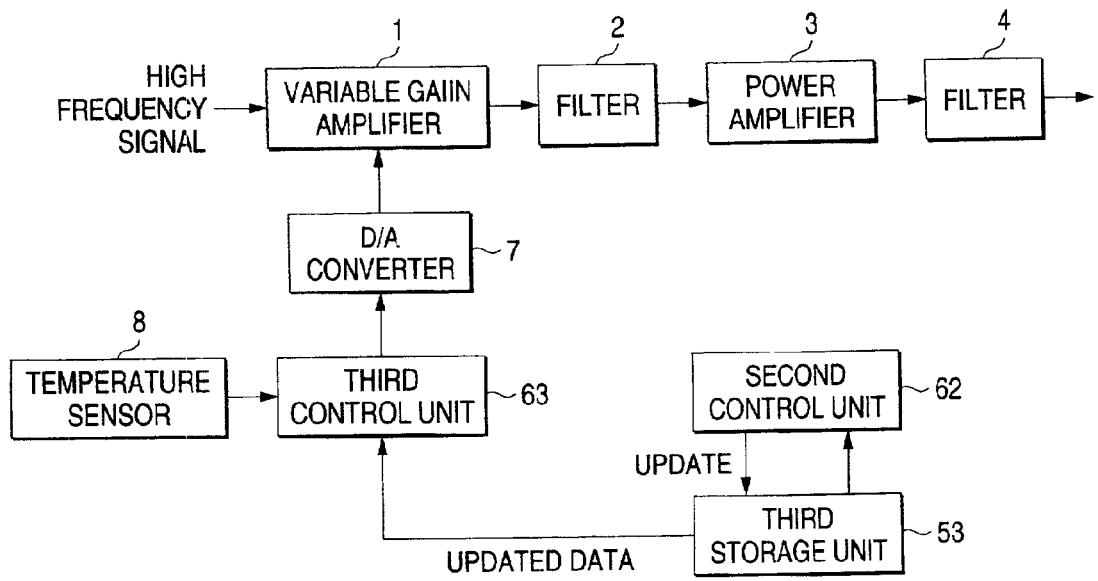
FIG. 7 is a block diagram for showing a transmission circuit equipped with a transmission output correcting apparatus according to a sixth embodiment mode of the present invention.

FIG. 7 is a block diagram for showing a structure of a transmission circuit equipped with a transmission output correcting apparatus according to a sixth embodiment of the present invention. The transmission circuit of this sixth embodiment is arranged by employing a third storage unit 53, a second control unit 62, a third control unit 63, and a temperature sensor 8 instead of both the first storage unit 51 and the first control unit 61 of the first embodiment shown in FIG. 1. In the third storage unit 53, specific frequencies, gain data corresponding to these specific frequencies, and also local maximum frequencies at both an ordinary temperature and a specific temperature have been stored. The second control unit 62 reads out the specific frequencies and the gain data corresponding thereto from the third storage unit 53, and updates the storage contents of the third storage unit 53 based upon such frequency data corrected by executing a predetermined calculation. The third control unit 63 reads out the updated data from the third storage unit 53, and executes a predetermined calculation based upon this updated data so as to correct a subdivision of a frequency block at an arbitrary temperature, and further, outputs the correction result to the D/A converter 7. The temperature sensor 8 senses an ambient temperature to output a temperature sensing signal. It should also be noted that the same reference numerals shown in FIG. 1 will be employed as those for denoting the same structures of FIG. 7, and explanations thereof are omitted.

This sixth embodiment corresponds to such an embodiment accomplished by combining the second embodiment with the fourth embodiment. In the transmission circuit of the sixth embodiment, a calculation is made of a difference between a previously-stored local maximum frequency and such a local maximum frequency which is calculated by executing a formula based upon frequencies and gain data corresponding to these frequencies, and then, all of frequency data are corrected/updated based upon this calculated difference. Next, another calculation is carried out so as to acquire a difference between a previously-stored local maximum frequency and such a local maximum frequency at an arbitrary temperature, which is calculated by executing a formula based on local maximum frequencies at the ordinary temperature and a specific temperature, and then, a frequency block is corrected by using this calculated difference.

Next, a principle idea of operations of the sixth embodiment will now be explained. First, the second control unit 62 calculates both the local maximum frequency "v" and the gain data "W" at this local maximum frequency in accordance with the manner as explained in the second embodiment based upon the gain data shown in the table 1, which have been previously stored in the third storage unit 53 so as to update the data listed in the table 1. Next, the third control unit 63 reads out this updated gain data from the third storage unit 53, and corrects the frequency data based upon the temperature "t" sensed by the temperature sensor 8 in accordance with the manner as explained in the third embodiment. Furthermore, the third control unit 63 supplies the gain data to the D/A converter 7 in accordance with the corrected frequency block. Then, the D/A converter 7 converts this gain data into a gain control signal and then supplies this gain control signal to the variable gain amplifier 1. As a result, the gain of the variable gain amplifier 1 is variably controlled in response to both the ambient temperature and the transmission frequency, so that the transmission output level is maintained at a constant level and in high precision over the entire range of the transmission frequency.

[Embodiment 7]

Figure 8:
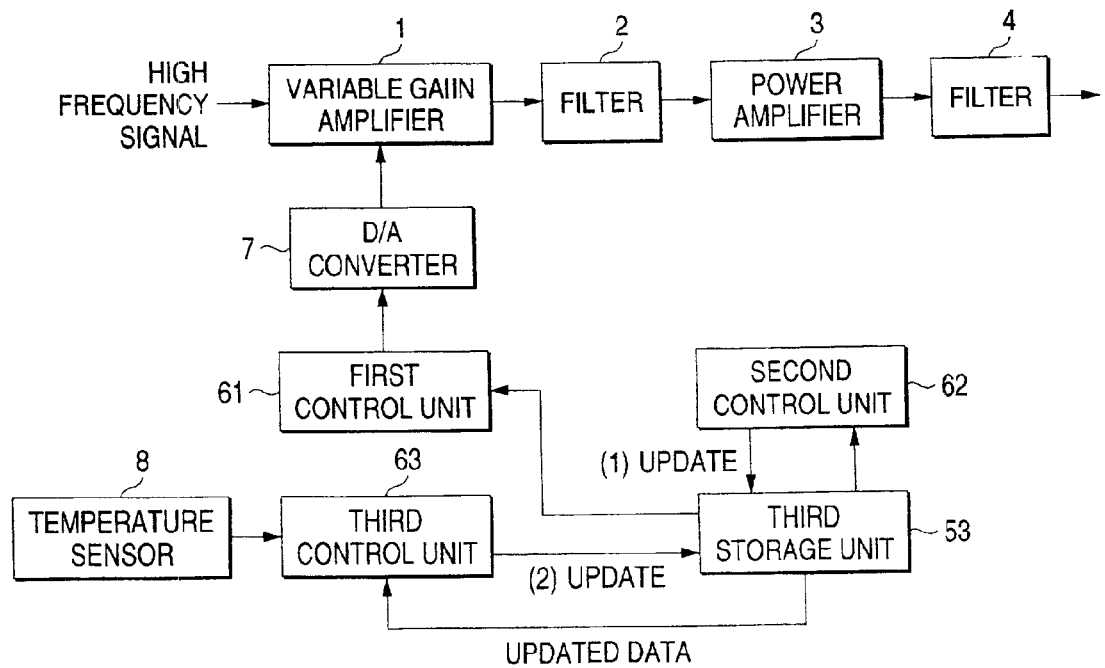
FIG. 8 is a block diagram for indicating a transmission circuit equipped with a transmission output correcting apparatus according to a seventh embodiment mode of the present invention.

FIG. 8 is a block diagram for showing a structure of a transmission circuit equipped with a transmission output correcting apparatus according to a seventh embodiment of the present invention. The transmission circuit of this seventh embodiment is arranged by employing the above-described third storage unit 53 of the fifth embodiment, a second control unit 62, a third control unit 63, a first control unit 61, and a temperature sensor 8 instead of the first storage unit 51 of the first embodiment shown in FIG. 1. The second control unit 62 reads out the specific frequencies and the gain data corresponding thereto from the third storage unit 53, and updates the storage contents of the third storage unit 53 based upon such frequency data corrected by executing a predetermined calculation. The third control unit 63 reads out the updated data from the third storage unit 53, and executes a predetermined calculation based upon this read data so as to correct a subdivision of a frequency block at an arbitrary temperature, and further updates the data content of the third storage unit 53. The first control unit 61 reads out both the updated specific frequency and the updated gain data from the third control unit 53, and executes a predetermined calculation so as to correct gain data at an arbitrary frequency, and also supplies the corrected gain data to the D/A converter 7. The temperature sensor 8 senses an ambient temperature to output a temperature sensing signal. It should also be noted that the same reference numerals shown in FIG. 1 will be employed as those for denoting the same structures of FIG. 8, and explanations thereof are omitted.

This seventh embodiment corresponds to such an embodiment accomplished by combining the first embodiment and the second embodiment with the fourth embodiment. In the transmission circuit of the seventh embodiment, a calculation is made of a difference between a previously-stored local maximum frequency and such a local maximum frequency which is calculated by executing a formula based upon frequencies and gain data corresponding to these frequencies, and then, all of frequency data are corrected/updated based on this calculated difference. Next, another calculation is carried out so as to acquire a difference between a previously-stored local maximum frequency and such a local maximum frequency at an arbitrary temperature, which is calculated by executing a formula based on each of local maximum frequency data, the ordinary temperature, and a specific temperature, and then, a frequency block is corrected by using this calculated difference. Furthermore, such gain data at an arbitrary frequency with the frequency block is acquired by executing a formula based upon the updated data, and this acquired gain data is extended to all of the frequency blocks, so that gain data at the arbitrary frequencies over the entire range of the frequencies.

Next, a description is made of a principle idea of operations of the seventh embodiment. First, in the first storage unit 51, as indicated in the table 1, the specific frequencies "o", "p", "q", "r", and "s", and the gain data "E", "A", "B", "C", and "D", corresponding thereto have been previously stored, and further, as shown in another table 3, both local maximum frequencies "J" and "K" at an ordinary temperature "$t_0$" and a specific temperature "$t_1$", have been previously stored. Also, gain data corresponding to the respective local maximum frequencies have been previously stored in this first storage unit 51.

The second control unit 62 reads out both the specific frequencies and the gain data indicated in the table 1 from the third storage unit 53, and calculates the local maximum frequency "v" and the gain data "W" at this local maximum frequency "v" in the manner as explained in the second embodiment so as to update the data of the table 1 which have been stored in the third storage unit 53.

The third control unit 53 reads out the above-explained temperatures "$t_0$" and "$t_1$", and also the local maximum frequencies at the respective temperatures from the third storage unit 53, and then, calculates a local maximum frequency "L" at the arbitrary temperature "t" as explained in the third embodiment. Then, the third control unit 63 calculates a difference "z" between the local maximum frequency "L" calculated in this manner and the local maximum frequency "K" at the ordinary temperature "$t_0$". Then, the third control unit 63 corrects/updates the frequency data indicated in the table 1 stored in the third storage unit 53, as indicated in the table 5.

While the transmission operation of this seventh embodiment is carried out, the first control unit 61 reads out the updated gain data from the third storage unit 53, and as previously explained in the first embodiment, acquires such gain data corresponding to an arbitrary frequency. The D/A converter 7 D/A-converts these gain data into gain control signals and then, supplies these gain control signals to the variable gain amplifier 1. As a result, the gain of the variable gain amplifier 1 may be variably controlled in response to both the temperature and the transmission frequency, and thus, the transmission output level may be maintained at a constant level and in high precision.

Figure 9:
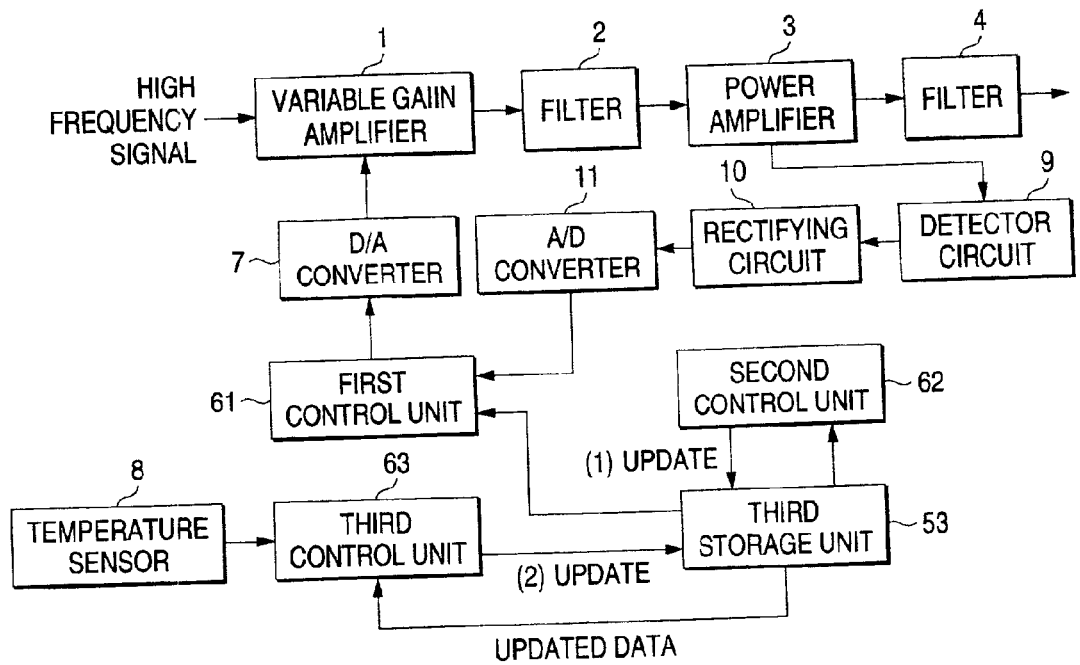
FIG. 9 is a block diagram for showing a transmission circuit equipped with a transmission output correcting apparatus according to another embodiment mode of the present invention.
Figure 10:
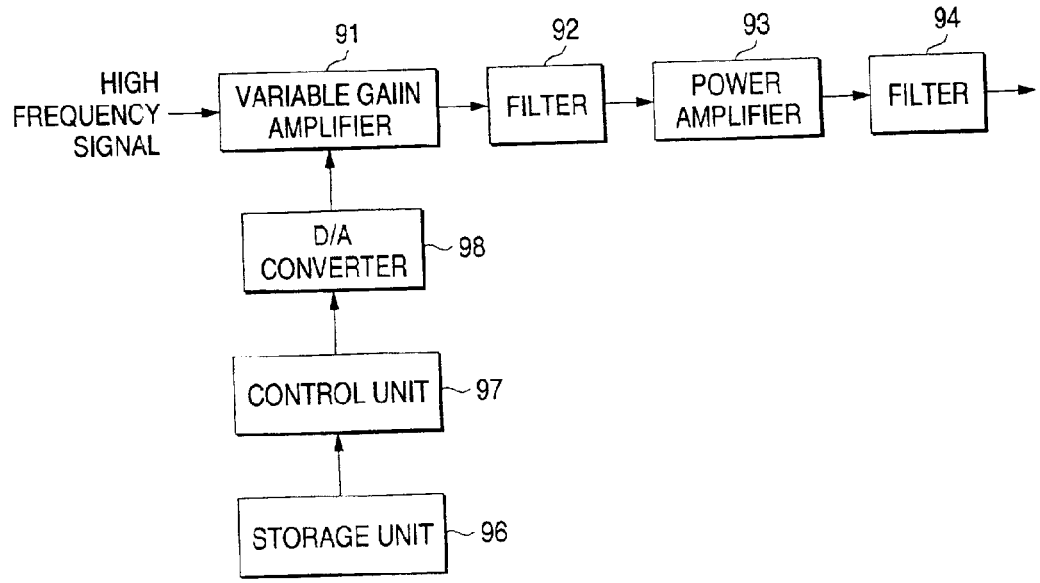
FIG. 10 is a block diagram for indicating one structural example of the conventional transmission output correcting apparatus.
Figure 11A:
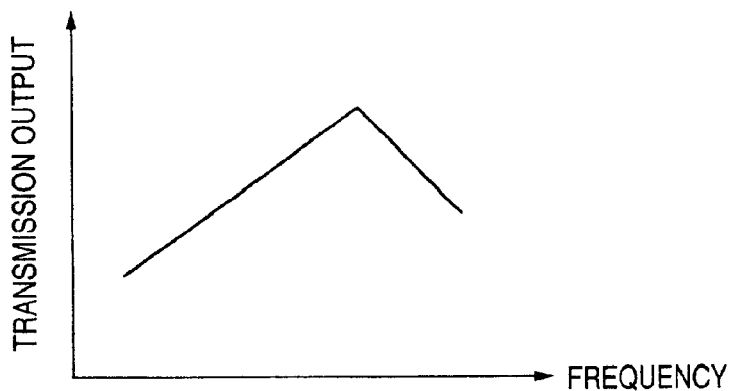
FIG. 11A is a graph for representing the characteristic in the case that the ambient temperature is made constant.
Figure 11B:
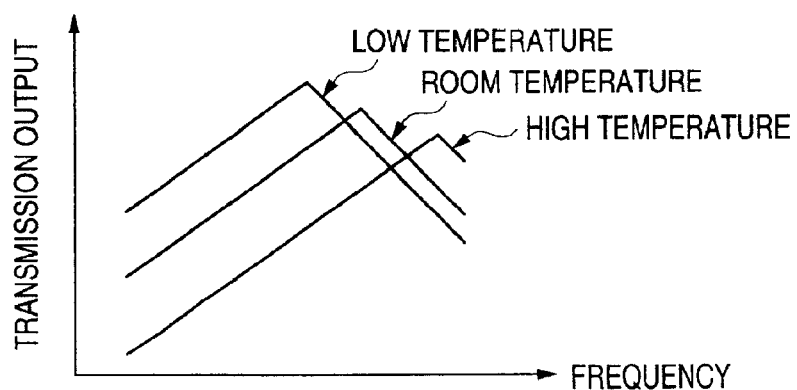
FIG. 11B is a graph for showing the characteristic in the case that the ambient temperature is varied.
Figure 12:
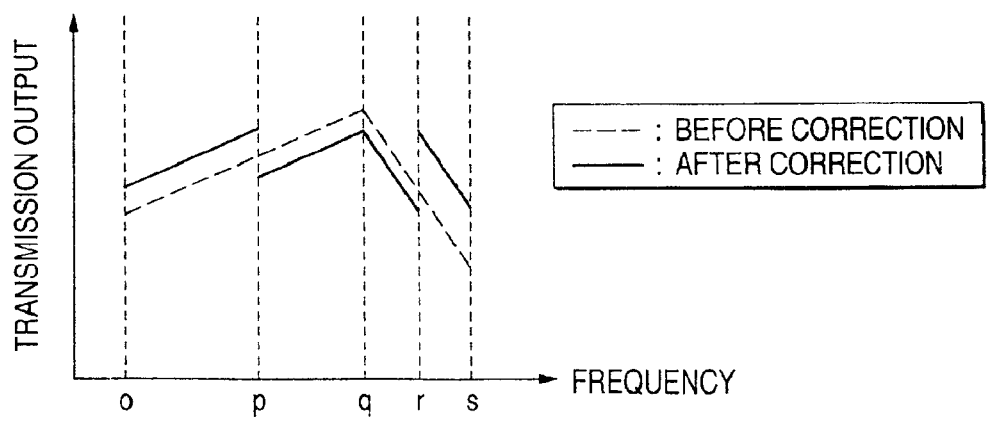
FIG. 12 is a graph for indicating one example of the frequency characteristic in the case that the transmission frequency range is subdivided into a plurality of frequency blocks, and the transmission output is corrected in accordance with the conventional correction manner.

Also, as indicated in FIG. 9, a transmission circuit may be arranged by that in addition to the structure of the seventh embodiment, while a portion of the output signal derived from the power amplifier 3 is entered into a detector circuit 9, this output signal is converted into such an analog signal indicative of a transmission level by a rectifier circuit 10, and this analog signal is converted into a digital value by an A/D converter 11, and then, this digital value is fed back to the first control unit 61. The first control unit 61 compares the feedback signal with the gain data which has been corrected/updated in a similar manner to that of the seventh embodiment and has been stored in the third storage unit 53, and controls the gain data in such a manner that the transmission level becomes equal to a predetermined transmission output level. As a result, the transmission output of the entire transmission frequency range may be maintained at a constant output and in high precision.

In the above-described explanation of the embodiments according to the present invention, the subdividing method of the frequency blocks has been described as the model manners. Alternatively, the frequency block may be subdivided in correspondence with wireless channels of a communication system equipped with the transmission output apparatus. Alternatively, a plurality of wireless channels may be set in correspondence with a single frequency block.

Also, in the above-explained first to seventh embodiments, as to the specific frequencies stored in the first to third storage units, the frequency blocks, and the respective gain data corresponding to these frequency blocks, any one of prepared/defined data, and other data which are acquired by adjusting the gain of the variable gain amplifier to measure in such a manner that a defined transmission output level can be obtained may be used. This may be similarly applied to the local maximum frequencies at the specific temperatures, which are stored in both the second and third storage units.

Furthermore, in the above-explained first to seventh embodiments, and the embodiment shown in FIG. 9, the first to third storage units and the first to third control units are independently employed. Alternatively, while a storage unit is combined with a control unit, these storage and control units may be arranged in an integral form.

Also, in the case that the wireless transmission circuit equipped with the transmission output correcting circuit according to the embodiment of the present invention is applied to a wireless communication apparatus, the correction operation of the gain data may be carried out as a portion of adjusting works performed by a manufacturer. Alternatively, the correction operation of the gain data may be performed during a partial time period of a transmission operation of an apparatus by a user.

The wireless transmission circuit equipped with the transmission output correcting circuit according to this embodiment may be mounted on a mobile communication apparatus known as a portable telephone (wireless system such as PDC, IS-95, IMT-2000 (W-CDMA)) capable of arbitrarily accessing a large number of communication channels, and the PHS (Personal Handyphone System), and also, a portable terminal apparatus equipped with such a wireless communication means. As a consequence, the transmission output of the entire transmission frequency range can be maintained at a constant output and in high precision, the communication characteristics of these apparatus can be improved.

As previously explained, in accordance with the present invention, since the gain data at the arbitrary frequency of the entire frequency range can be obtained, the transmission output level can be maintained at a constant level over the entire transmission range. Also, even in such a case that the frequency characteristic is changed due to the fluctuation of the components, this changed frequency characteristic can be detected and corrected, and the transmission output level can be maintained in a constant level over the entire transmission range. Furthermore, while the frequency blocks are corrected in response to the ambient temperature, the gain of the variable gain unit can be variably controlled in accordance with both the ambient temperature and the transmission frequency. As a result, there is such an effect that the transmission output level can be maintained at a constant level and in high precision.

In accordance with the transmission output correcting apparatus of the present invention, a large number of subdivided frequency blocks are not required. As a consequence, since a small number of specific frequencies and a small number of gain data corresponding to these specific frequencies are merely stored, the storage capacity of the storage means can be reduced and the circuit arrangement can be made simple. Also, the variable gain unit may use the conventional structure, and furthermore, the production of the gain data can be carried out by executing the calculation based upon the data stored in the storage means. As a consequence, the process operation of the gain data production can be made simple, and the process time can be shortened, so that such a simple and high-precision transmission output correcting apparatus can be obtained.

Furthermore, the transmission characteristic of the wireless communication apparatus such as the portable telephone to which the transmission circuit equipped with the transmission output correcting apparatus of the present invention has been applied can be improved.

What is claimed is:

1. A transmission output correcting apparatus in which a frequency range is subdivided into a plurality of frequency blocks and a gain control operation is carried out every said frequency block, comprising:

a variable gain unit for inputting thereinto a high frequency signal and capable of variably changing an amplification gain based upon a gain control signal;

a storage unit for storing specific frequencies and gain data of gains corresponding to said specific frequencies;

a control unit for reading both said specific frequencies and said gain data from said storage unit, and for executing a predetermined calculation to calculate gain data corresponding to an arbitrary frequency that is different from said specific frequencies; and a D/A converter for converting said calculated gain data into said gain control signal.

2. A transmission output correcting apparatus in which a frequency range is subdivided into a plurality of frequency blocks and a gain control operation is carried out every said frequency block, comprising:

a variable gain unit for inputting thereinto a high frequency signal and capable of variably changing an amplification gain based upon a gain control signal;

a storage unit for storing specific frequencies (o, p, q, r, s) and gain data (E, A, B, C, D) of gains corresponding to said specific frequencies, said specific frequencies including a local maximum frequency, q, which is a frequency at which a transmission output becomes maximum;

a control unit for reading both said specific frequencies (o, p, q, r, s) and said gain data (E, A, B, C, D) from said storage unit, and for executing a predetermined calculation to calculate a frequency (v) at which a transmission output before a correction is performed becomes maximum, and also for correcting said specific frequencies (o, p, q, r, s) based upon a difference between said calculated frequency (v) and said local maximum frequency (q); and a D/A converter for converting said gain data at said corrected frequency data into said gain control signal.

3. A transmission output correcting apparatus in which a transmission frequency range is subdivided into a plurality of frequency blocks and a gain control operation is carried out every said frequency block, comprising:

a variable gain unit for inputting thereinto a high frequency signal and capable of variably changing an amplification gain based upon a gain control signal;

a storage unit for storing specific frequencies and gain data of gains corresponding to said specific frequencies;

a first control unit for reading both said specific frequencies and said gain data from said storage unit, and for executing a predetermined calculation to correct said specific frequency data;

a second control unit for reading both said corrected specific frequency data and said gain data from said storage unit to calculate gain data corresponding to an arbitrary frequency that is different from said specific frequencies; and a D/A converter for converting said calculated gain data into said gain control signal.

4. A transmission output correcting apparatus in which a transmission frequency range is subdivided into a plurality of frequency blocks and a gain control operation is carried out every said frequency block, comprising:

a variable gain unit for inputting thereinto a high frequency signal and capable of variably changing an amplification gain based upon a gain control signal;

a temperature sensor for sensing an ambient temperature to output a temperature sensing signal;

a storage unit for storing specific frequency blocks, gain data corresponding to said specific frequency blocks, and a frequency at which a transmission output before a correction is carried out at a specific temperature becomes maximum;

a control unit for reading said frequency at which the transmission output before the correction is performed becomes maximum from said storage unit, for executing a predetermined calculation to calculate a frequency at which a transmission output before a correction is carried out at an arbitrary temperature becomes maximum, and for correcting said specific frequency block data based upon a difference between said calculated frequency and a frequency at which the transmission output before the correction is performed at an ordinary temperature becomes maximum and which has been stored into said storage unit; and a D/A converter for converting said gain data corresponding to said corrected frequency block data.

5. A transmission output correcting apparatus in which a transmission frequency range is subdivided into a plurality of frequency blocks and a gain control operation is carried out every said frequency block, comprising:

a variable gain unit for inputting thereinto a high frequency signal and capable of variably changing an amplification gain based upon a gain control signal;

a temperature sensor for sensing an ambient temperature to output a temperature sensing signal;

a storage unit for storing specific frequencies, gain data corresponding to said specific frequencies, and a frequency at which a transmission output before a correction is carried out at a specific temperature becomes maximum;

a first control unit for reading out said frequency at which the transmission output before the correction is performed becomes maximum from said storage unit, for executing a predetermined calculation to calculate a frequency at which a transmission output before a correction is carried out at an arbitrary temperature becomes maximum, and for correcting said specific frequency data based upon a difference between said calculated frequency and a frequency at which the transmission output before the correction is performed at an ordinary temperature becomes maximum and which has been stored into said storage unit;

a second control unit for reading out both said corrected specific frequency data and said gain data from said storage unit, and for executing a predetermined calculation to calculate gain data corresponding to an arbitrary frequency; and a D/A converter for converting said calculated gain data into said gain control signal.

6. A transmission output correcting apparatus in which a transmission frequency range is subdivided into a plurality of frequency blocks and a gain control operation is carried out every said frequency block, comprising:

a variable gain unit for inputting thereinto a high frequency signal and capable of variably changing an amplification gain based upon a gain control signal;

a temperature sensor for sensing an ambient temperature to output a temperature sensing signal;

a storage unit for storing specific frequencies, gain data corresponding to said specific frequencies, and a frequency at which a transmission output before a correction is carried out at a specific temperature becomes maximum;

a first control unit for reading out both said specific frequencies and said gain data from said storage unit, and for executing a predetermined calculation to calculate a frequency at which a transmission output before a correction is performed becomes maximum, and also for correcting said specific frequency data based upon a difference between said calculated frequency and said frequency at which the transmission output before the correction at an ordinary temperature is performed becomes maximum and which has been stored in said storage unit;

a second control unit for reading out said frequency at which the transmission output before the correction is performed becomes maximum from said storage, for executing a predetermined calculation to calculate a frequency at which a transmission output before a correction is carried out at an arbitrary temperature becomes maximum, and for further correcting said specific frequency data based upon a difference between said calculated frequency and a frequency at which the transmission output before the correction is performed at the ordinary temperature becomes maximum and which has been stored into said storage unit; and a D/A converter for converting said gain data at said corrected frequency data into said gain control signal.

7. A transmission output correcting apparatus in which a transmission frequency range is subdivided into a plurality of frequency blocks and a gain control operation is carried out every said frequency block, comprising:

a variable gain unit for inputting thereinto a high frequency signal and capable of variably changing an amplification gain based upon a gain control signal;

a temperature sensor for sensing an ambient temperature to output a temperature sensing signal;

a storage unit for storing specific frequencies, gain data corresponding to said specific frequencies, and a frequency at which a transmission output before a correction is carried out at a specific temperature becomes maximum;

a first control unit for reading out both said specific frequencies and said gain data from said storage unit, and for executing a predetermined calculation to calculate such a frequency at which a transmission output before a correction is performed becomes maximum, and also for correcting said specific frequency data based upon a difference between said calculated frequency and said frequency at which the transmission output before the correction is performed becomes maximum at an ordinary temperature and which has been stored in said storage unit;

a second control unit for reading out said frequency at which the transmission output before the correction is performed becomes maximum from said storage unit, for executing a predetermined calculation to calculate such a frequency at which a transmission output before a correction is carried out at an arbitrary temperature becomes maximum, and for further correcting said corrected specific frequency data based upon a difference between said calculated frequency and such a frequency at which the transmission output before the correction is performed at the ordinary temperature becomes maximum and which has been stored into said storage unit;

a third control unit for reading out both the further-corrected specific data and said gain data from said storage unit, and for executing a predetermined calculation to gain data corresponding to arbitrary frequency; and a D/A converter for converting said gain data at said corrected frequency data into said gain control signal.

8. A wireless communication apparatus comprising a wireless transmission circuit equipped with the transmission output correcting apparatus, wherein said transmission output correcting apparatus includes:

a variable gain unit for inputting thereinto a high frequency signal and capable of variably changing an amplification gain based upon a gain control signal;

a storage unit for storing specific frequencies and gain data of gains corresponding to said specific frequencies;

a control unit for reading out both said specific frequencies and said gain data from said storage unit, and for executing a predetermined calculation to calculate gain data corresponding to an arbitrary frequency that is different from said specific frequencies; and a D/A converter for converting said calculated gain data into said gain control signal.

9. A portable telephone comprising a wireless transmission circuit equipped with the transmission output correcting apparatus, wherein said transmission output correcting apparatus includes:

a variable gain unit for inputting thereinto a high frequency signal and capable of variably changing an amplification gain based upon a gain control signal;

a storage unit for storing specific frequencies and gain data of gains corresponding to said specific frequencies;

a control unit for reading both said specific frequencies and said gain data from said storage unit, and for executing a predetermined calculation to calculate gain data corresponding to an arbitrary frequency that is different from said specific frequencies; and a D/A converter for converting said calculated gain data into said gain control signal.

* * * * *